(12) United States Patent
Onodera

(10) Patent No.: US 9,614,514 B2
(45) Date of Patent: Apr. 4, 2017

(54) PWM MODULATION DEVICE AND SOUND SIGNAL OUTPUT APPARATUS

(71) Applicant: ROHM CO., LTD., Ukyo-Ku, Kyoto (JP)

(72) Inventor: Takeshi Onodera, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/925,058

(22) Filed: Oct. 28, 2015

(65) Prior Publication Data
US 2016/0134268 A1 May 12, 2016

(30) Foreign Application Priority Data

Nov. 7, 2014 (JP) ................................. 2014-226990

(51) Int. Cl.
| | |
|---|---|
| *H04R 3/00* | (2006.01) |
| *H03K 7/08* | (2006.01) |
| *H03F 3/185* | (2006.01) |
| *H03F 3/217* | (2006.01) |

(52) U.S. Cl.
CPC .............. *H03K 7/08* (2013.01); *H03F 3/185* (2013.01); *H03F 3/2173* (2013.01); *H04R 3/00* (2013.01); *H03F 2200/03* (2013.01); *H03F 2200/351* (2013.01)

(58) Field of Classification Search
CPC .. H03F 2200/351; H03F 3/185; H03F 3/2173; H03F 2200/03; H03K 7/08; H04R 3/00
See application file for complete search history.

(56) References Cited

U.S. PATENT DOCUMENTS

| | | | | |
|---|---|---|---|---|
| 2004/0222866 A1* | 11/2004 | Stengel | ................... | H03K 5/131 332/109 |
| 2006/0034365 A1* | 2/2006 | Song | ..................... | H03F 1/3223 375/238 |
| 2007/0083277 A1* | 4/2007 | Mallinson | ............. | H03M 7/302 700/94 |
| 2008/0297382 A1* | 12/2008 | Risbo | ...................... | G10L 19/10 341/53 |
| 2013/0088294 A1* | 4/2013 | Heineman | ................. | H03F 1/26 330/207 A |

FOREIGN PATENT DOCUMENTS

| | | |
|---|---|---|
| JP | 2001345705 A | 12/2001 |
| JP | 2004048333 A | 2/2004 |
| JP | 2013017047 A | 1/2013 |

* cited by examiner

*Primary Examiner* — Muhammad N Edun
(74) *Attorney, Agent, or Firm* — Cantor Colburn LLP

(57) ABSTRACT

A PWM modulation device includes: a PWM modulator which receives upper N bits of an (N+1)-bit output from a noise shaper; a rising/falling edge detector which receives a PWM output signal of the PWM modulator and detects a rising/falling edge; a delay circuit which receives the PWM output signal, delays the PWM output signal by a predetermined delay time and outputs a PWM output delay signal; an AND gate which receives the lower one bit output from the noise shaper and an output control signal of the rising/falling edge detector; and a selector which receives a signal obtained as a result of an AND operation by the AND gate for the output control signal and the lower one bit and selects one of the PWM output signal and the PWM output delay signal.

19 Claims, 12 Drawing Sheets

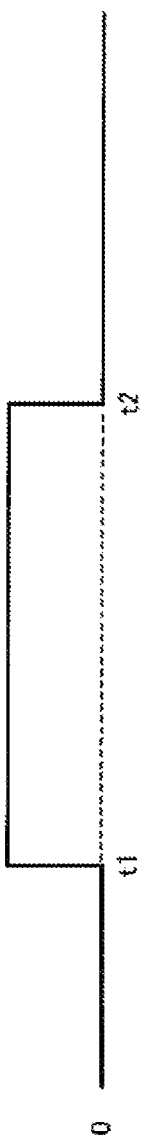
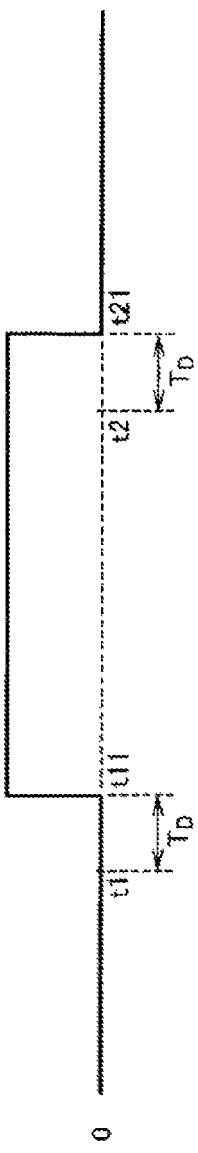
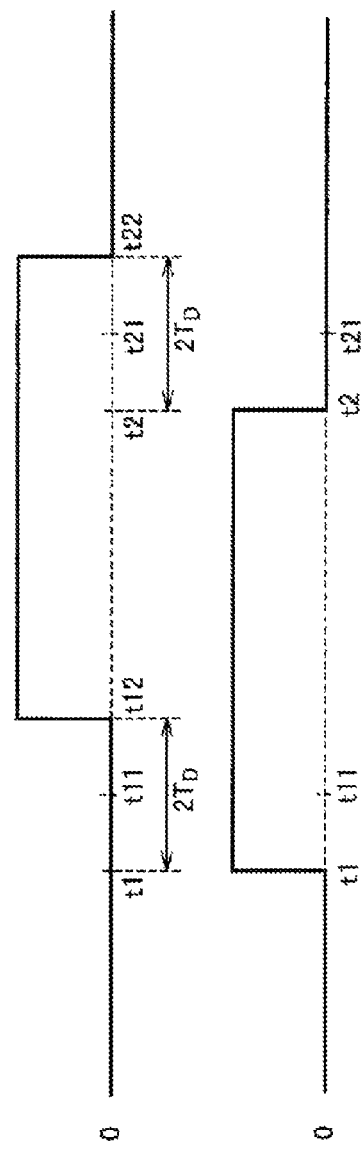
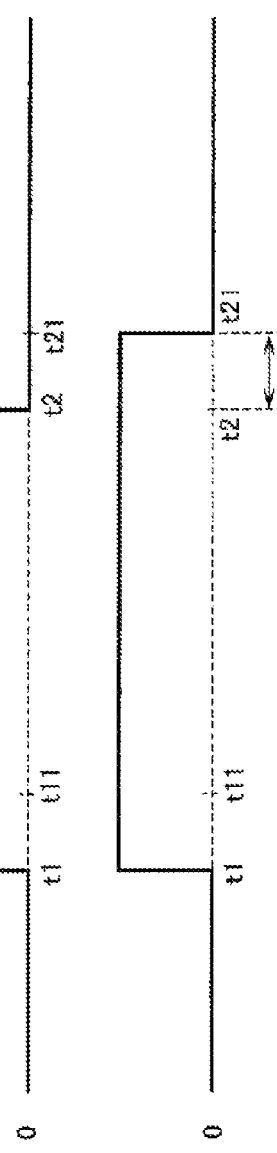

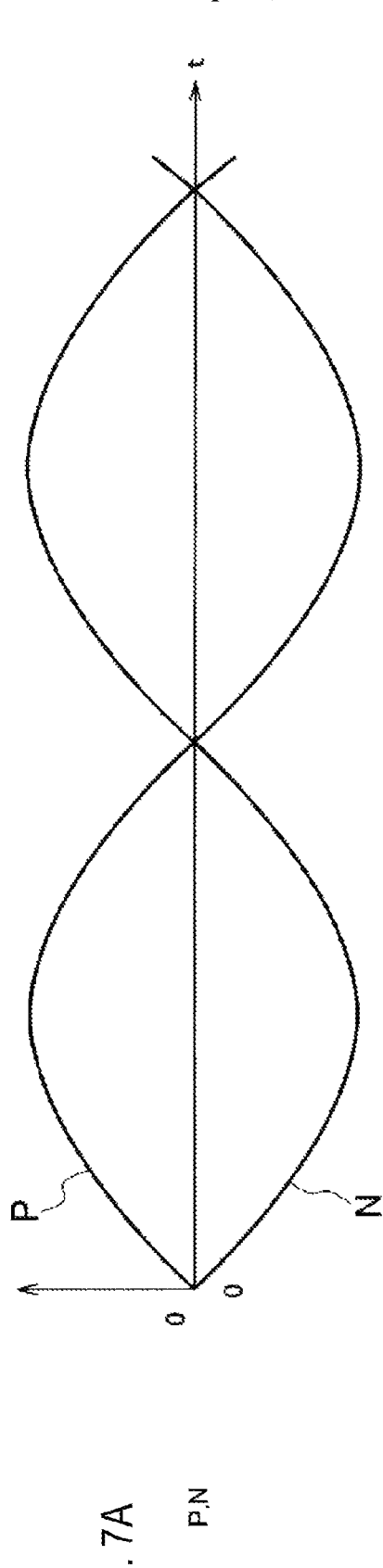
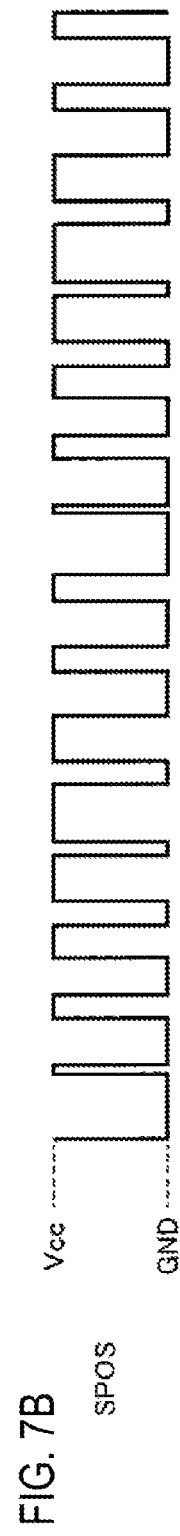
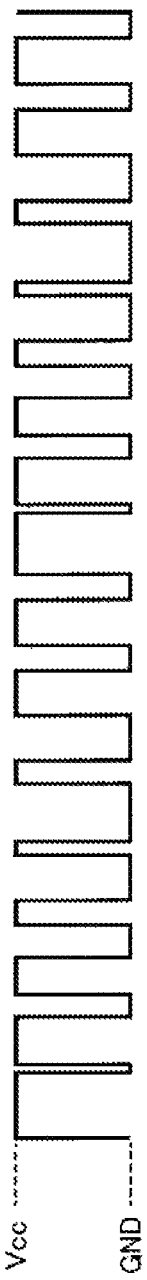
FIG. 7A
FIG. 7B
FIG. 7C

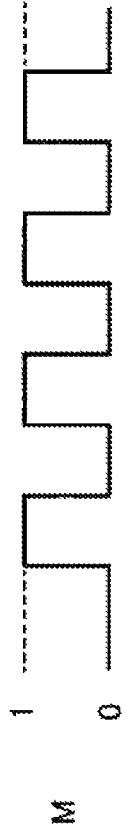
FIG. 14A  M
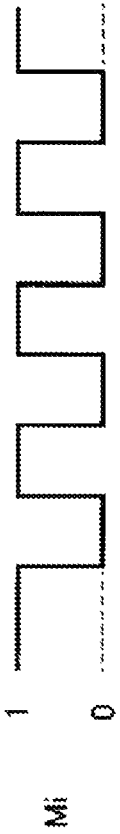
FIG. 14B  Mi
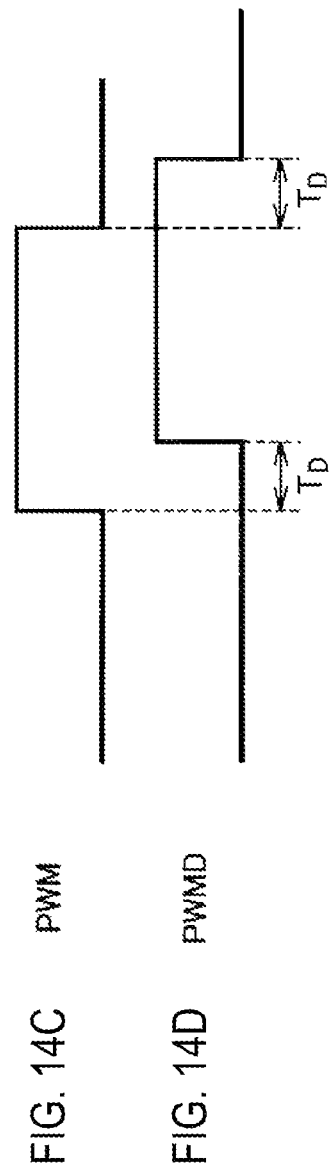
FIG. 14C  PWM
FIG. 14D  PWMD

PWM MODULATION DEVICE AND SOUND SIGNAL OUTPUT APPARATUS

CROSS-REFERENCE TO RELATED APPLICATION

The present invention claims priority under 35 U.S.C. §119 to Japanese Application No. 2014-226990, filed on Nov. 7, 2014, the entire content of which is incorporated herein by reference.

TECHNICAL FIELD

The present disclosure relates to a pulse width modulation device and a sound signal output apparatus.

BACKGROUND

Pulse modulation is a modulation method for generating a signal by changing a pulse. For example, pulse density modulation (PDM) generates a waveform based on density and sign (e.g., a plus, minus sign) of a pulse having a certain width. As another example, pulse width modulation (PWM) generates a waveform based on a width and a sign of a variable pulse.

In connection with these techniques, techniques related to a PWM-based D-class amplifier have been disclosed. In addition, techniques related to a multi-bit PDM signal gain adjustment circuit have been disclosed. Further, PWM modulators capable of improving a resolution and a dynamic range have been disclosed.

SUMMARY

The present disclosure provides some embodiments of a PWM modulation device which is capable of a resolution of a PWM modulator, and a sound signal output apparatus to which the PWM modulator device is applied.

According to one embodiment of the present disclosure, there is provided a PWM modulation device including: a PWM modulator which receives upper N bits of an (N+1)-bit output from a noise shaper; a rising/falling edge detector which receives a PWM output signal of the PWM modulator and detects a rising/falling edge; a delay circuit which receives the PWM output signal, delays the PWM output signal by a predetermined delay time and outputs a PWM output delay signal; an AND gate which receives the lower one bit output from the noise shaper and an output control signal of the rising/falling edge detector; and a selector which receives a signal obtained as a result of an AND operation by the AND gate for the output control signal and the lower one bit and selects one of the PWM output signal and the PWM output delay signal.

According to another embodiment of the present disclosure, there is provided a sound signal output apparatus including: a synchronous sampling rate converter; a digital signal processor connected to the synchronous sampling rate converter; an oversampling filter connected to the digital signal processor; a noise shaper connected to the oversampling filter; first and second PWM modulation devices connected to the noise shaper; first and second driver output stages connected respectively to outputs of the first and second PWM modulation devices; first and second low pass filters connected respectively to outputs of the first and second driver output stages; and a speaker connected to the first and second low pass filter.

BRIEF DESCRIPTION OF THE DRAWINGS

FIGS. 4A to 4E are timing charts of operation waveforms of the PWM modulation device according to one embodiment, where FIG. 4A shows a waveform example of a PWM output signal PWM of the PWM modulator, FIG. 4B shows a waveform example of an output delay signal PWMD of a delay circuit, FIG. 4C shows a waveform example of an output control signal CS of a rising/falling edge detector, FIG. 4D shows a waveform example of a PWM_0 output of a selector when the lower one bit is 0, and FIG. 4E shows a waveform example of a PWM_0 output of the selector when the lower one bit is 1.

FIGS. 7A to 7C show examples of operation waveforms of the sound signal output apparatus (BTL-based D-class amplifier) to which the PWM modulation devices according to the embodiment are applied, where FIG. 7A shows a P/N output waveform example of a noise shaper, FIG. 7B shows a SPOS waveform example of a driver output stage, and FIG. 7C shows a SNEG waveform example of a driver output stage.

FIGS. 14A to 14D are timing charts of an operation waveform of the delay circuit shown in FIG. 13, where FIG. 14A shows a waveform example of a master clock, FIG. 14B shows a waveform example of an inverted master clock obtained by inverting the master clock by an inverter, FIG. 14C shows a waveform example of a PWM output signal PWM of a PWM modulator, and FIG. 14D shows a waveform example of an output delay signal PWDM of a gate delay circuit.

DETAILED DESCRIPTION

Figure 1:
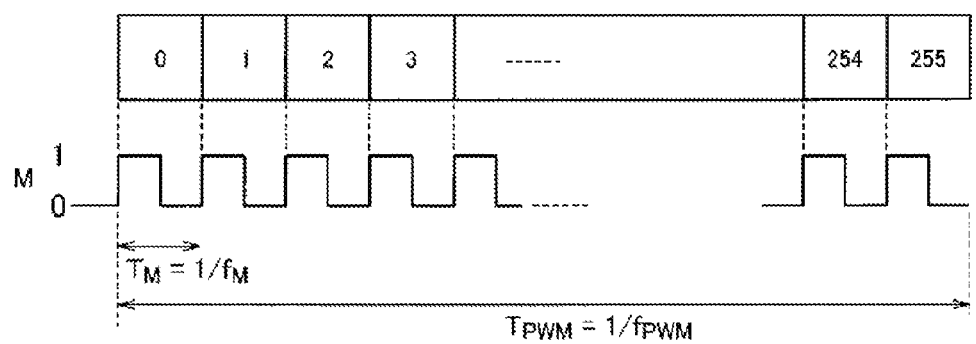
FIG. 1 is a schematic explanatory view for explaining a PWM modulation frequency and resolution in a PWM modulator according to a comparative example.

The embodiments of the present disclosure will now be described in detail with reference to the drawings. Throughout the drawings, the same or similar elements are denoted by the same or similar reference numerals. It is however noted that the drawings are just schematic and relationships between thickness and planar dimension of elements, thickness ratios of various layers and so on may be unrealistic. Accordingly, detailed thickness and dimensions should be determined in consideration of the following description. In addition, it is to be understood that the figures include different dimensional relationships and ratios.

The following embodiments are provided to illustrate devices and methods to embody the technical ideas of the present disclosure and are not limited to materials, forms, structures, arrangements and so on of elements detailed herein. The embodiments of the present disclosure may be modified in different ways without departing from the spirit and scope of the invention defined in the claims.

Comparative Example

FIG. 1 is a schematic explanatory view for explaining a PWM modulation frequency and resolution in a PWM modulator according to a comparative example.

In the PWM modulator according to the comparative example, if a master clock M is used for modulation, a resolution is limited by the master clock M. For example, assuming that a sampling frequency $f_{PWM}$ of the PWM modulator is 768 kHz, if the PWM modulation is performed with the master clock M of 196.608 MHz (=768 kHz×256), its resolution is 256.

Embodiments

Figure 2:
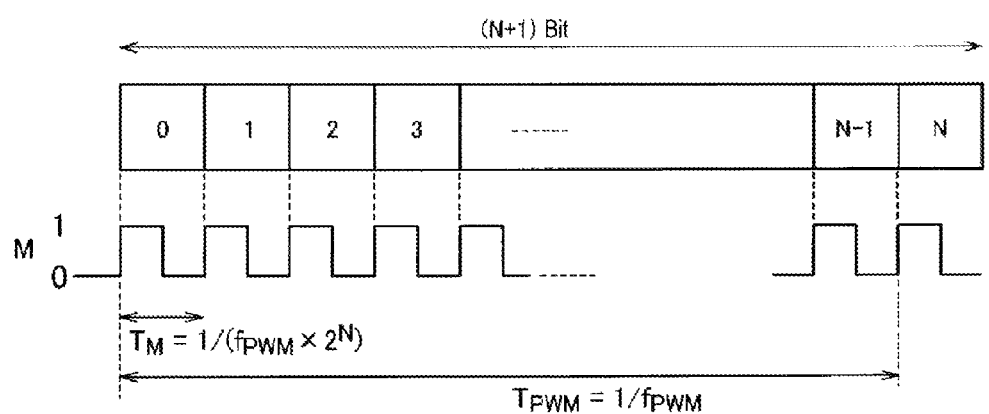
FIG. 2 is a schematic explanatory view for explaining a PWM modulation frequency and resolution in a PWM modulation device according to one embodiment of the present disclosure.

FIG. 2 is a schematic explanatory view for explaining a PWM modulation frequency and resolution in a PWM modulation device according to one embodiment of the present disclosure.

Assuming that a sampling frequency is $f_{PWM}$, a frequency $f_M$ of a master clock M is indicated by $(f_{PWM} \times 2^N)$. When an input to the PWM modulation device 180 (see FIG. 3) is (N+1) bits, the upper N bits in the (N+1) bits are input to an N-bit PWM modulator 18 (see FIG. 3) and the remaining lower one bit is input to an AND gate 28 (see FIG. 3). For an output PWM of the N-bit PWM modulator 18, a rising edge and a falling edge are used to prepare an output control signal CS.

The PWM output waveform is delayed by a delay time $T_D$ through a delay circuit 30 to generate a PWMD output. Here, the delay time $T_D$ is set to be equal to $1/(f_{PWM} \times 2^{N+1})$ which is a value obtained by dividing $1/(f_{PWM} \times 2^N)$ by two.

A signal obtained by the AND gate 28 to perform an AND operation for the output control signal CS and the lower one bit is input to a selector 32 (see FIG. 3) which selects one of the PWM output signal and the delay signal PWMD. When the lower one bit is 0, the PWM output signal can be obtained as it is. On the other hand, when the lower one bit is 1, a signal obtained by delaying an H section of PWM by the delay time $T_D$ is output.

In the PWM modulation scheme according to the comparative example, the PWM resolution is limited by the master clock (or main clock) M. If the frequency $f_M$ of the master clock M is $f_{PWM} \times 2^N$, the PWM resolution is limited to N bits.

In the PWM modulation scheme according to the embodiment, the master clock (main clock) M is not changed, thereby achieving the PWM resolution of (N+1) bits.

Thus, since the resolution can be improved by one bit, as compared to the comparative example, characteristics can be improved by 6 dB.

(PWM Modulation Device and Sound Signal Output Apparatus)

Figure 3:
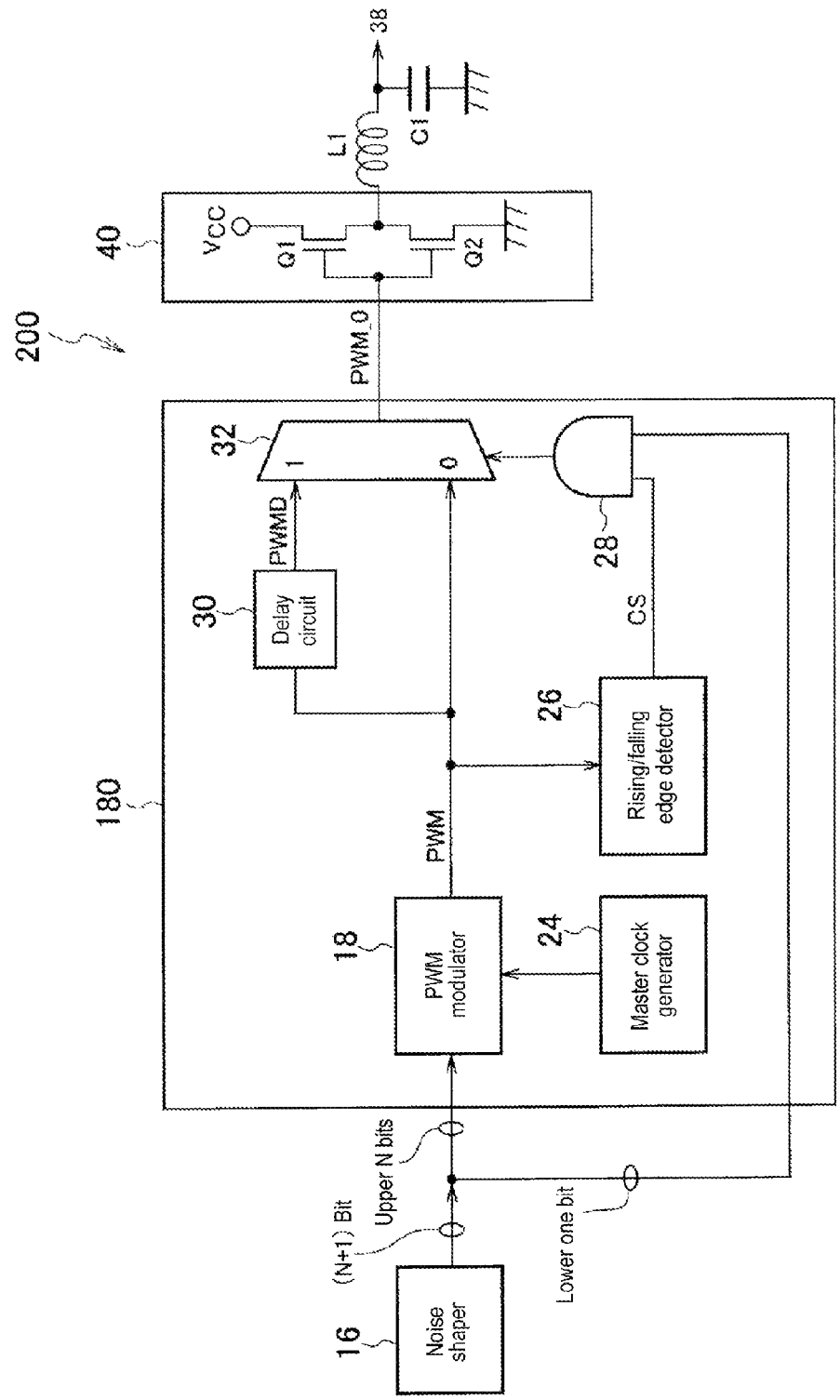
FIG. 3 is a schematic block diagram of a PWM modulation device and a sound signal output apparatus to which the PWM modulation device is applied, according to one embodiment of the present disclosure.

FIG. 3 is a schematic block diagram of the PWM modulation device 180 and a sound signal output apparatus 200 to which the PWM modulation device 180 is applied, according to one embodiment of the present disclosure.

Referring to FIG. 3, the PWM modulation device 180 according to one embodiment of the present disclosure includes a PWM modulator 18 which receives the upper N bits of an (N+1)-bit output from a noise shaper 16, a rising/falling edge detector 26 which receives a PWM output signal PWM of the PWM modulator 18 and detects a rising and falling edge, a delay circuit 30 which receives the PWM output signal PWM, and delays it by a delay time $T_D$ and outputs an output delay signal PWMD, an AND gate 28 which receives the lower one bit output from the noise shaper 16 and an output control signal CS from the rising/falling edge detector 26, and a selector 32 which receives a signal obtained as a result of an AND operation by the AND gate 28 for the output control signal CS and the lower one bit and selects one of the output signal PWM and the output delay signal PWMD.

FIGS. 4A to 4E are timing charts of operation waveforms of the PWM modulation device 180 according to one embodiment of the present disclosure, where FIG. 4A shows the PWM output signal PWM of the PWM modulator 18, FIG. 4B shows the output delay signal PWMD, FIG. 4C shows the output control signal CS of the rising/falling edge detector 26, FIG. 4D shows a PWM_0 output of the selector 32 when the lower one bit is 0, and FIG. 4E shows a PWM_0 output of the selector 32 when the lower one bit is 1.

In the PWM modulation device 180 according to one embodiment, the PWM_0 output of the selector 32 is the PWM output signal PWM when the lower one bit is data 0, as shown in FIG. 4D, and is a signal obtained by delaying a high level H section of the PWM output signal PWM by the delay time $T_D$ when the lower one bit is data 1, as shown in FIG. 4E.

In addition, the PWM modulation device 180 according to the embodiment may further include a master clock generator 24 for supplying the master clock M to the PWM modulator 18.

Here, in the PWM modulation device 180 according to the embodiment, assuming that a sampling frequency of the PWM modulator 18 is $f_{PWM}$ and a master clock frequency is $f_M$, the master clock frequency $f_M$ is equal to $f_{PWM} \times 2^N$ and a delay time $T_D$ is equal to $1/(f_{PWM} \times 2^{N+1})$ which is a value obtained by dividing the period of the master clock M (i.e., $1/(f_{PWM} \times 2^N)$) by two.

The sound signal output apparatus 200 to which the PWM modulation device 180 according to the embodiment is applied includes the noise shaper 16, the PWM modulation device 180 connected to the noise shaper 16, a driver output stage 40 connected to the output of the selector 32, and a low pass filter L1/C1 connected to an output of the driver output stage 40, as shown in FIG. 3. In addition, the low pass filter L1/C1 may be connected to a speaker 38. The driver output stage 40 is interposed between a power supply voltage $V_{CC}$ and a ground potential and may include a CMOS inverter circuit consisting of a p channel MOSFET Q1 and an n channel MOSFET Q2.

Figure 5:
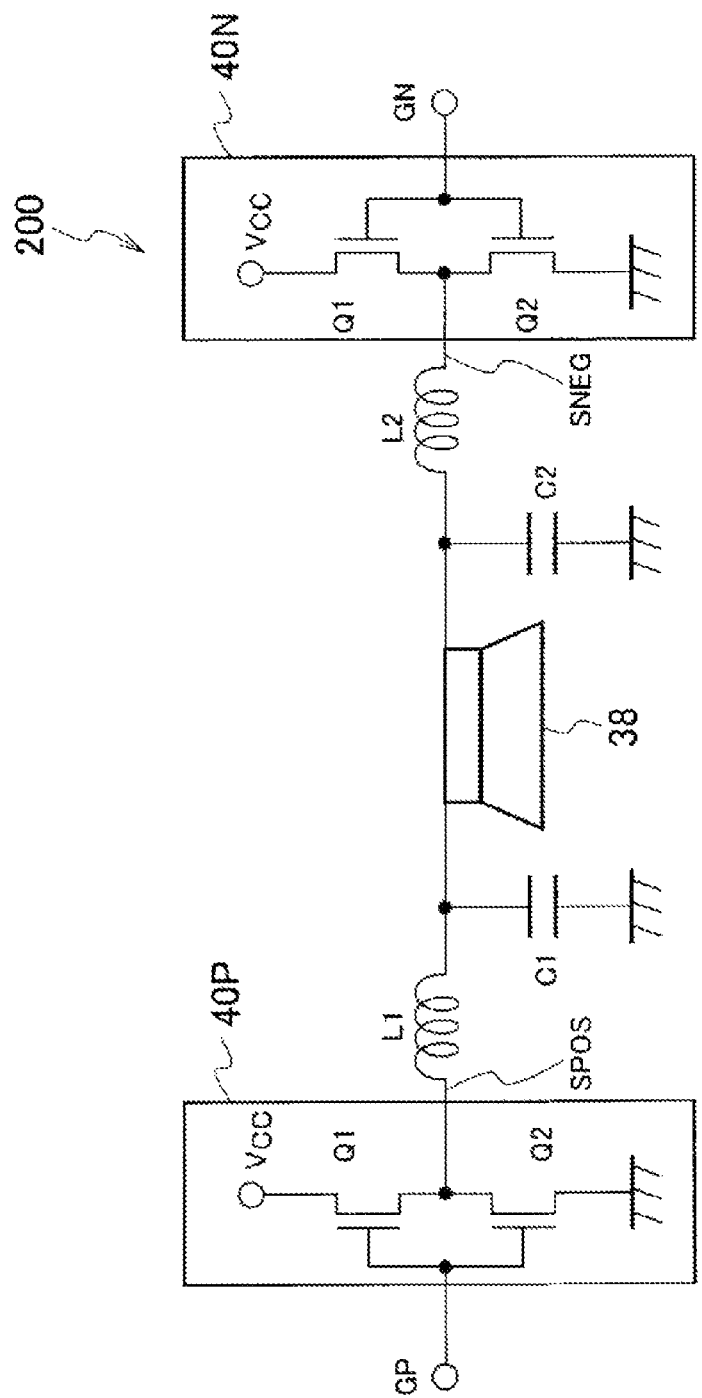
FIG. 5 shows a configuration of an output circuit of a sound signal output apparatus (BTL-based D-class amplifier) to which the PWM modulation device according to one embodiment can be applied.

FIG. 5 shows a configuration of an output circuit of the sound signal output apparatus (BTL-based D-class amplifier) 200 to which the PWM modulation device 180 according to one embodiment can be applied.

The PWM modulation device 180 according to the embodiment can be applied to the BTL-based D-class amplifier, as shown in FIG. 5.

The BTL (Bridged Transformer Less or Balanced Transformer Less) scheme is a method of using two D-class amplifiers (driver output stages) whose outputs are bridge-connected, to form a single amplifier. A PWM signal with a positive phase is input to one of the two driver output stages, and a PWM signal with a negative phase is input to the other. Signals output from the driver output stages are integrated by a low pass filter and are used to directly drive a speaker. It is possible to improve a dynamic range by applying signals with opposite polarities to both terminals of the speaker.

A gate input signal GP at a positive side is supplied to a gate input of a driver output stage 40P, and a gate input signal GN at a negative side is supplied to a gate input of a driver output stage 40N. Here, the gate input signals GP and GN correspond to a selector output PWM_0 of a PWM modulation device 180P at the positive side and a selector output PWM_0 of a PWM modulation device 180N at the negative side, respectively.

In addition, output waveforms of the driver output stages 40P and 40N correspond to a positive side PWM signal waveform SPOS and a negative side PWM signal waveform SNEG as shown in FIGS. 7B and 7C, respectively.

The selector output PWM_0 of the PWM modulation device 180P at the positive side is supplied as the gate input signal GP to the driver output stage 40P and the selector output PWM_0 of the PWM modulation device 180N at the negative side is supplied as the gate input signal GN to the driver output stage 40N. A power supply voltage $V_{CC}$ is supplied to the driver output stages 40P and 40N. The gate input signal GP and the gate input signal GN have opposite polarities and also have a complementary relationship.

Inductance L1 and capacitance C1 at the positive side constitute a low pass filter. An output of the driver output stage 40P is connected to one end of the inductance L1 and the other end of the inductance L1 is connected to the capacitance C1 and the speaker 38. The positive side PWM signal SPOS is demodulated by the low pass filter L1 and C1 into an analog output signal which is then supplied to the speaker 38.

Similarly, inductance L2 and capacitance C2 at the negative side constitute a low pass filter. An output of the driver output stage 40N is connected to one end of the inductance L2 and the other end of the inductance L2 is connected to the capacitance C2 and the speaker 38. The negative side PWM signal SNEG is demodulated by the low pass filter L2 and C2 into an analog output signal which is then supplied to the speaker 38.

(Sound Signal Output Apparatus to which PWM Modulation Device is Applied)

Figure 6:
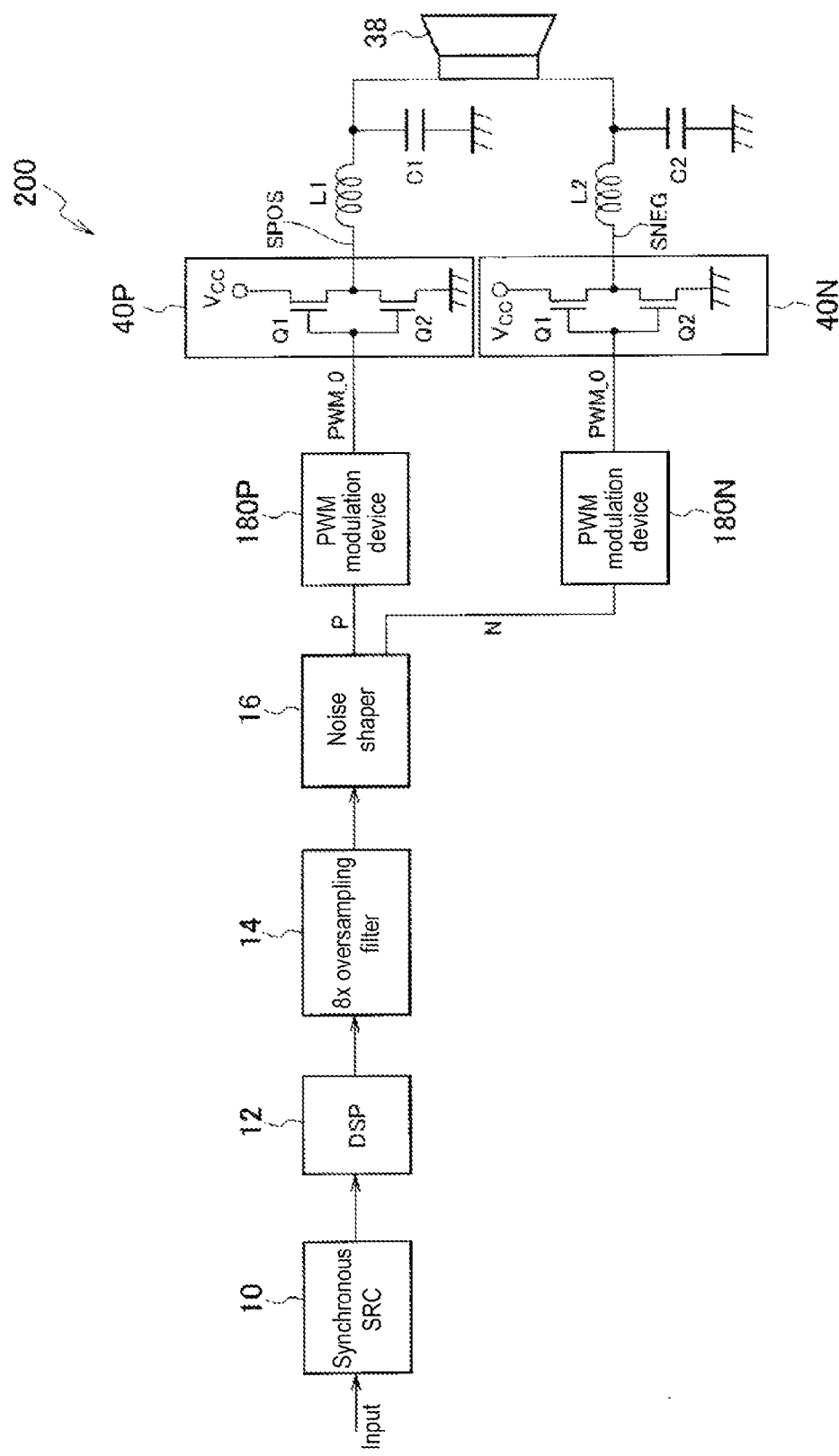
FIG. 6 is a schematic circuit block diagram of a sound signal output apparatus (BTL-based D-class amplifier) to which the PWM modulation devices according to one embodiment are applied.

FIG. 6 is a schematic circuit block diagram of a sound signal output apparatus (BTL-based D-class amplifier) to which the PWM modulation devices 180P and 180N are applied according to one embodiment of the present disclosure.

As illustrated in FIG. 6, the sound signal output apparatus (BTL-based D-class amplifier) to which the PWM modulation devices 180P and 180N are applied according to the embodiment includes a synchronous sampling rate converter (synchronous SRC) 10, a digital signal processor (DSP) 12, an 8× oversampling filter 14, the noise shaper 16, the PWM modulation devices 180P and 180N, the driver output stages 40P and 40N, the low pass filters L1/C1 and L2/C2 and the speaker 38.

The synchronous SRC 10 receives a digital signal (for example, a digital audio signal) of a specified sampling rate in synchronization with the master clock M and converts it into a sampling frequency which has a sampling rate different from the original (specified) sampling rate and is output to the DSP 12.

The DSP 12 receives a digital signal output from the SRC 10, subjects it to audio signal processing such as gain control and tone control to generate a digital audio signal of a PCM (Pulse Code Modulation) type which is output to the 8× oversampling filter 14.

The 8× oversampling filter 14 oversamples the digital audio signal and outputs it to the noise shaper 16. More specifically, the 8× oversampling filter 14 samples data at a frequency a certain number of times (in this example, a certain predetermined times is set to 8 times) higher than the original sampling frequency. For example, the filter 14 converts a sampling frequency of 48 kHz or 44.1 kHz into a PWM frequency of 384 kHz or 352.8 kHz.

The noise shaper 16 performs noise shaping to reduce a quantization error noise level of a digital audio signal output from the 8× oversampling filter 14 and outputs a result of the noise shaping to the PWM modulation devices 180P and 180N.

The modulation devices 180P and 180N spread or narrow pulse widths of an output P at the positive side and an output N at the negative side, which are output from the noise shaper 16, by one period of the master clock, and generate an output pulse signals having a pulse width corresponding to the input data.

The output PWM_0 from the PWM modulation device 180P at the positive side is supplied, as a gate input signal GP, to the driver output stage 40P and the output PWM_0 from the PWM modulation device 180N at the negative side is supplied, as a gate input signal GN, to the driver output stage 40N. The stages after the driver output stages 40P and 40N have the same configuration and operation as the sound signal output apparatus (BTL-based D-class amplifier) 200 shown in FIG. 5.

FIGS. 7A to 7C show examples of operation waveforms of the sound signal output apparatus (BTL-based D-class amplifier) to which the PWM modulation devices are applied according to one embodiment, where FIG. 7A shows a P/N output waveform example of the noise shaper 16, FIG. 7B shows a SPOS waveform example of the driver output stage 40P, and FIG. 7C shows a SNEG waveform example of the driver output stage 40N.

Figure 8:
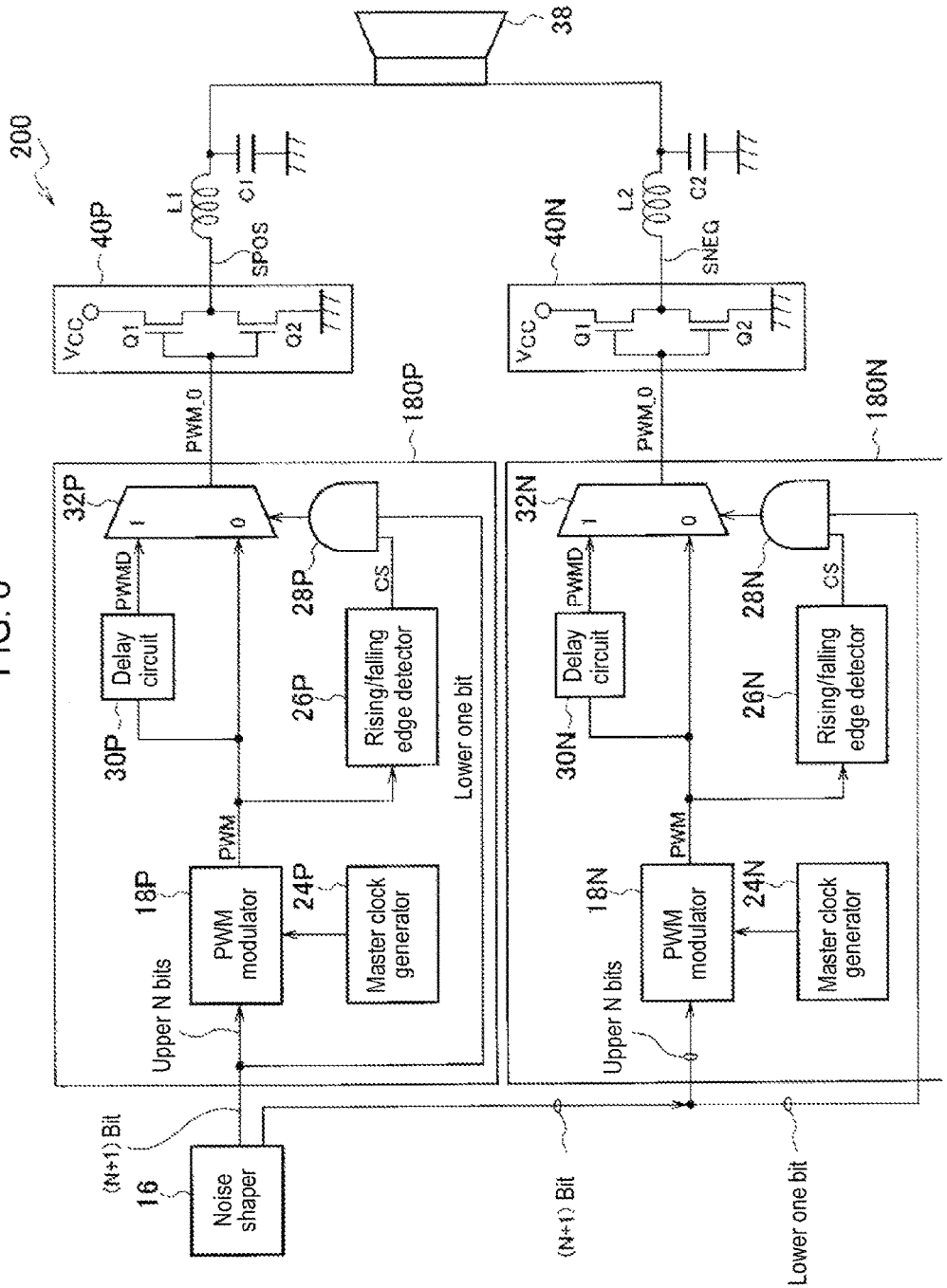
FIG. 8 is a detailed circuit block diagram of the sound signal output apparatus (BTL-based D-class amplifier) to which the PWM modulation devices according to one embodiment are applied.

FIG. 8 is a detailed circuit block diagram of the sound signal output apparatus (BTL-based D-class amplifier) to which the PWM modulation devices 180P and 180N are applied according to one embodiment of the present disclosure.

Like the PWM modulation device 180 shown in FIG. 3, the PWM modulation devices 180P and 180N according to one embodiment includes PWM modulators 18P and 18N each of which receives the upper N bits of an (N+1)-bit output from the noise shaper 16, rising and falling edge detectors 26P and 26N which receive PWM output signals PWM of the PWM modulators 18P and 18N, respectively, and detect a rising and falling edge, delay circuits 30P and 30N which receive the PWM output signals PWM from the PWM modulators 18P and 18N, respectively, delay them by a delay time $T_D$ and output delay signals PWMD, respectively, an AND gates 28P and 28N which receive the lower one bit from the noise shaper 16 and output control signals CS of the rising and falling edge detectors 26P and 26N, respectively, and selectors 32P and 32N which receive signals obtained as a result of an AND operation by the AND gates 28P and 28N for the output control signals CS and the lower one bit, respectively, and select one of the output signals PWM and the output delay signals PWMD.

Other configurations and operations of the PWM modulation devices 180P and 180N are the same as the sound signal output apparatus (BTL-based D-class amplifier) 200 shown in FIG. 6.

(Pulse Width Modulator which can be Applied to PWM Modulation Device)

Figure 9:
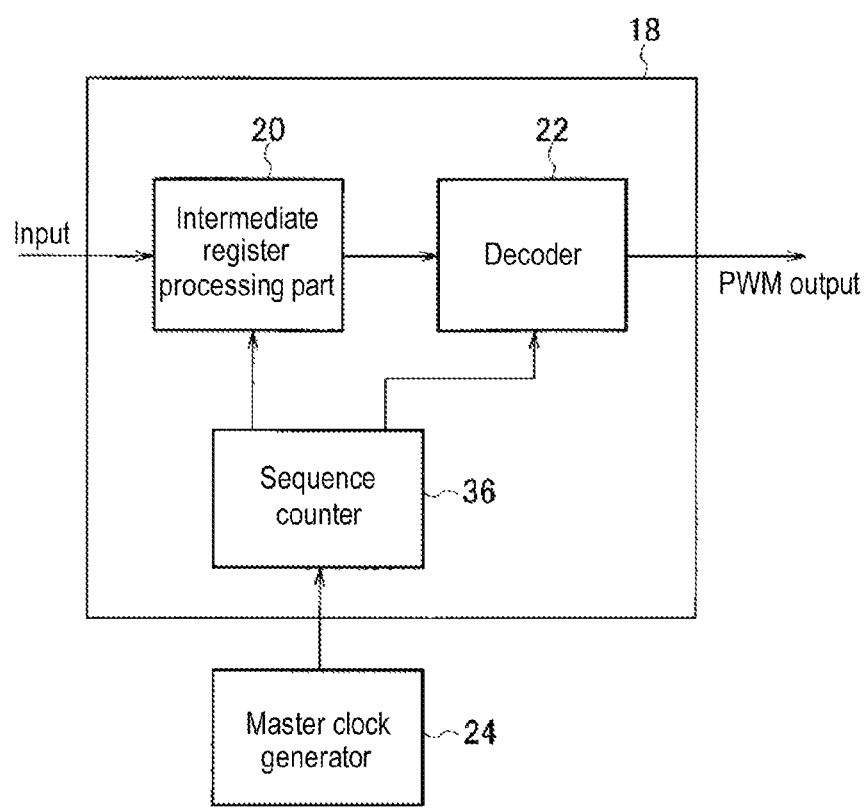
FIG. 9 is a schematic block diagram illustrating a pulse width modulator which can be applied to the PWM modulation device according to one embodiment of the present disclosure.

FIG. 9 is a schematic block diagram illustrating a pulse width modulator which can be applied to the PWM modulation device according to one embodiment of the present disclosure.

Figure 10:
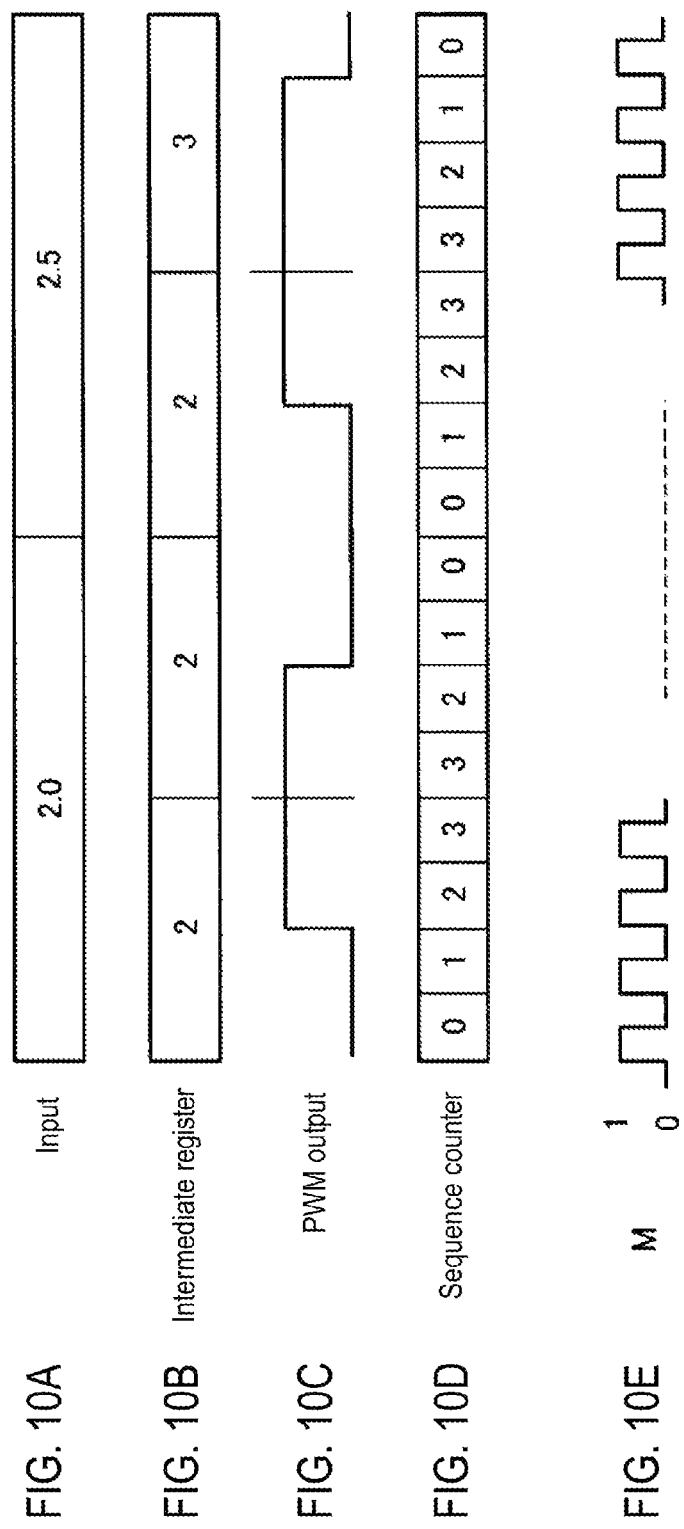
FIG. 10A shows an input signal pattern in generating a pulse waveform by the PWM modulator which can be applied to the PWM modulation device according to the embodiment.
FIG. 10B shows an intermediate register value.
FIG. 10C shows a PWM output pattern.
FIG. 10D shows an example of data of a sequence counter.
FIG. 10E shows a master clock.

FIG. 10A shows an input signal pattern in generating a pulse waveform by the PWM modulator 18 shown in FIG. 9 which can be applied to the PWM modulation device according to one embodiment of the present disclosure, where FIG. 10B shows an intermediate register value, FIG. 10C shows a PWM output pattern, FIG. 10D shows an example of data of a sequence counter 36, and FIG. 10E shows a master clock M.

As illustrated in FIG. 9, the pulse width modulator which can be applied to the PWM modulation device according to the embodiment is a pulse width modulator for generating an output signal by changing a pulse width of an input signal and includes (a) a sequence counter 36 which is connected to a master clock generator 24 and counts a count value in synchronization with the master clock M, (b) an intermediate register processing part 20 which determines whether an input signal is a first input signal pattern or a second input signal pattern, changes a pulse width such that the front and rear of a switching time point are symmetrical with respect to a switching time point of a switching period of the input signal based on the count value of the sequence counter 36 if the input signal is the first input signal pattern, changes the pulse width by one master clock M at the front or rear of the switching time point with respect to the switching time point of the switching period of the input signal based on the count value of the sequence counter 36 if the input signal is the second input signal pattern, and outputs the changed pulse width as an intermediate register value, and (c) a decoder 22 which generates an output signal according to the intermediate register value of the intermediate register processing part 20 based on the counter value of the sequence counter 36.

The sequence counter 36 counts at a timing synchronized with a clock and outputs the count value to both of the intermediate register processing part 20 and the decoder 22. For example, for 8× oversampling, as illustrated in FIG. 10D, the sequence counter 36 counts up as "0," "1," "2," and "3," and counts down as "3," "2," "1," and "0" at a switching time point (indicated by a vertical solid line in FIG. 10C) of the switching period, and again counts up as "0," "1," "2," and "3." The sequence counter 36 sequentially outputs count values counted in this manner to both of the intermediate register processing part 20 and the decoder 22. Although the count-up/count-down corresponding to the 8× oversampling is illustrated in FIGS. 10A to 10E, for example, the count-up/count-down is as "0," "1," "1," and "0" for 4× oversampling and is as "0," "1," "2," "3," "4," "5," "6," "7," "7," "6," "5," "4," "3," "2," "1," and "0" for 16× oversampling.

In addition, in order to flexibly change the count-up/count-down in response to a magnification of oversampling, for example, the sequence counter 36 may receive a value of magnification of oversampling from the 8× oversampling filter 14 shown in FIG. 6 and counts up/down based on the value of magnification.

The intermediate register processing part 20 generates the intermediate register value as shown in FIG. 10B from the input signal as shown in FIG. 10A based on the count value of the sequence counter 36 and outputs the generated intermediate register value to the decoder 22. The intermediate register processing part 20 determines whether the input signal is the first input signal pattern or the second input signal pattern. In this case, the intermediate register processing part 20 determines that the input signal is the first input signal pattern if a value of first position of decimal point is "0" and determines that the input signal is the second input signal pattern if the value of first position of decimal point is "5."

If the input signal is the first input signal pattern, the intermediate register processing part 20 changes a pulse width such that the front and rear of a switching time point are symmetrical with respect to a switching time point of the switching period of the input signal based on the count value of the sequence counter 36. In the example shown in FIGS. 10A to 10E, if a signal referring to an input signal pattern "2.0" is the input, the intermediate register processing part 20 determines that the signal is the first input signal pattern, and sets the intermediate register value to change a pulse width by spreading an interval of "High" level by one master clock M such that the front and rear of a switching time point are symmetrical with respect to a switching time point of the switching period of the signal. Accordingly, in this case, the intermediate register value is set such that the front and rear of the switching time point correspond to a pulse width of two master clocks M with respect to the switching time point of the switching period.

If the input signal is the second input signal pattern, the intermediate register processing part 20 changes the pulse width by one master clock M at the front or rear of the switching time point with respect to the switching time point of the switching period of the signal based on the count value of the sequence counter 36. In the example shown in FIGS. 10A to 10E, if a signal referring to an input signal pattern "2.5" is the input, the intermediate register processing part 20 determines that the signal is the second input signal pattern, and sets the intermediate register value to change a pulse width by spreading an interval of "High" level such that the rear of the switching time point is more by one master clock M than the front thereof with respect to the switching time point of the switching period of the signal. Accordingly, in this case, the intermediate register value is set such that the front of the switching time point corresponds to a pulse width of two master clocks M and the rear of the switching time point corresponds to a pulse width of three master clocks M with respect to the switching time point of the switching period. It is here noted that "more by one master clock M" may refer to that the front of the switching time point (the right side in FIGS. 10A to 10E) is more by one master clock M than the rear thereof (the left side in FIGS. 10A to 10E) with respect to the switching time point of the switching period.

The decoder 22 generates and outputs a PWM output signal pattern (PWM waveform) according to the intermediate register value of the intermediate register processing part 20 based on the count value of the sequence counter 36.

When the pulse width modulator which can be applied to the PWM modulation device according to the embodiment illustrated in FIG. 9 is embedded in a sound signal output apparatus, a resolution can be improved. As a result, it is possible to realize a sound signal output apparatus with an improved dynamic range.

As described above, the pulse width modulator according to the embodiment changes a pulse width such that the front and rear of the switching time point are symmetrical with respect to the switching time point of the switching period of the PWM signal if the input signal is the first input signal pattern, and changes the pulse width by one master clock M at the front or rear of the switching time point with respect to the switching time point of the switching period of the PWM signal if the input signal is the second input signal pattern. Therefore, since the pulse width is changed by one master clock unit, its resolution is twice as high as that in the comparative example.

Figure 11:
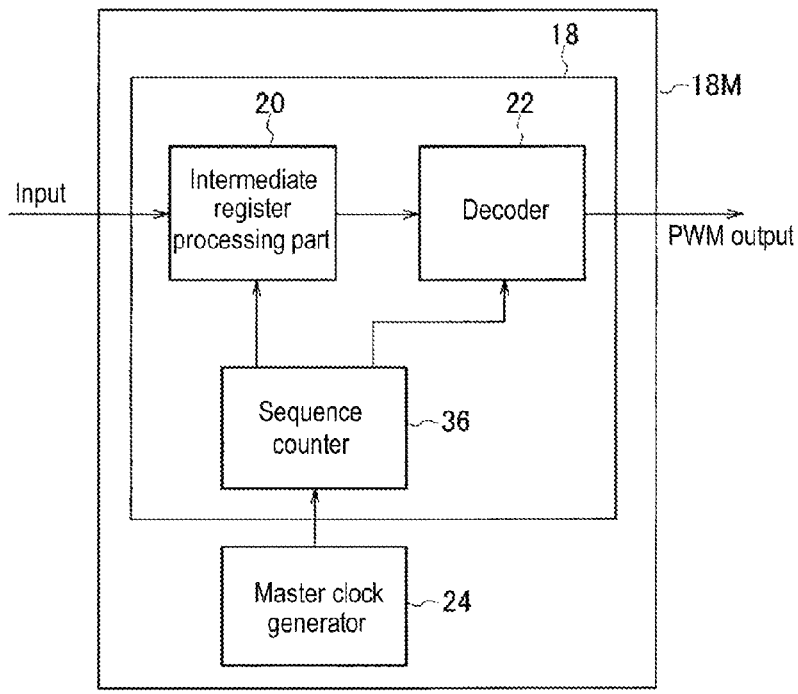
FIG. 11 is another schematic block diagram illustrating a PWM modulator which can be applied to the PWM modulation device according to one embodiment of the present disclosure.

FIG. 11 is another schematic block diagram illustrating a PWM modulator 18M which can be applied to the PWM modulation device according to one embodiment of the present disclosure. In the example of FIG. 11, one PWM modulator 18M is constituted by placing a master clock generator 24 in the same block as the PWM modulator 18. Other configurations are the same as the example shown in FIG. 9.

(Configuration of a Delay Circuit)

Figure 12A:
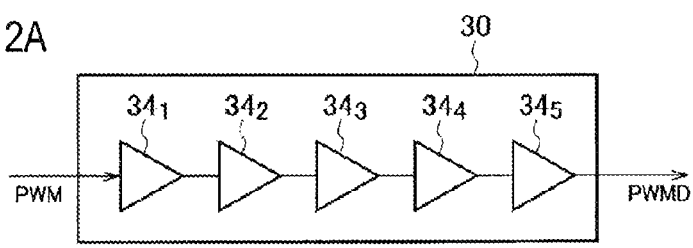
FIG. 12A shows a configuration example of a delay circuit which can be applied to the PWM modulation device according to one embodiment and FIG. 12B shows a configuration example of another delay circuit which can be applied to the PWM modulation device according to one embodiment of the present disclosure.
Figure 12B:
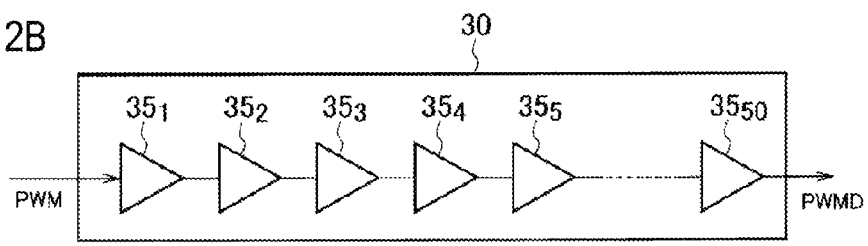

FIG. 12A shows a configuration example of a delay circuit 30 which can be applied to the PWM modulation device according to one embodiment and FIG. 12B shows a configuration example of another delay circuit 30 which can be applied to the PWM modulation device according to one embodiment of the present disclosure.

In the configuration example of FIG. 12A, a delay circuit 30 of 2.5 ns (=500 ps×5) can be configured by cascading five stages of inverters $34_1$, $34_2$, . . . , $34_5$, each of which has a delay time of about 500 ps.

Similarly, in the configuration example of FIG. 12B, a delay circuit 30 of 5 ns (=100 ps×50) can be configured by cascading fifty stages of inverters $35_1$, $35_2$, . . . , $35_{50}$, each of which has a delay time of about 100 ps.

Figure 13:
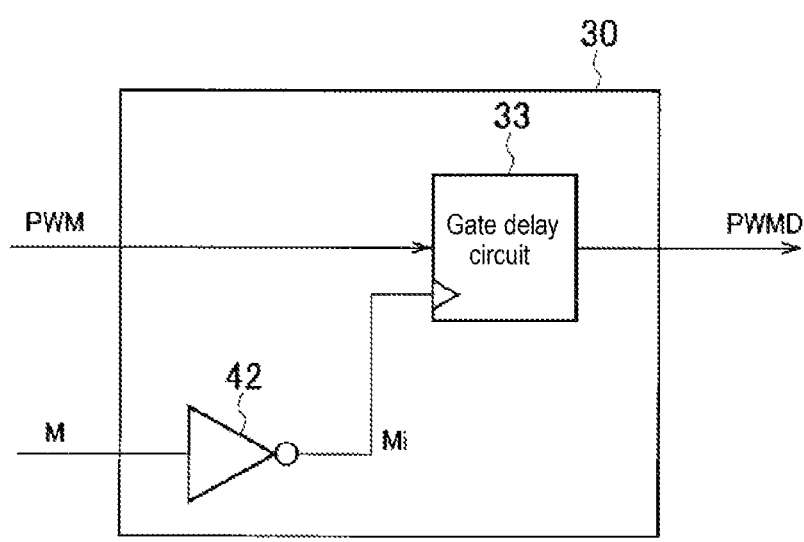
FIG. 13 shows a configuration example of another delay circuit which can be applied to the PWM modulation device according to one embodiment of the present disclosure.

FIG. 13 shows a configuration example of another delay circuit 30 which can be applied to the PWM modulation device according to one embodiment of the present disclosure. As illustrated, the delay circuit 30 includes an inverter 42 which receives the master clock M, and a gate delay circuit 33 which receives a master clock Mi obtained by inverting the master clock M with the inverter and a PWM output signal PWM of the PWM modulator 18.

FIGS. 14A to 14D are timing charts of an operation waveform of the delay circuit 30 shown in FIG. 13, where FIG. 14A shows a waveform example of the master clock M, FIG. 14B shows a waveform example of the master clock Mi obtained by inverting the master clock M by the inverter 42, FIG. 14C shows the PWM output signal PWM of the PWM modulator 18, and FIG. 14D shows an output delay signal PWDM of the gate delay circuit 33. A delay time $T_D$ indicated in FIG. 14D is equal to $1/(f_{PWM} \times 2^{N+1})$ which is obtained by dividing the period $1/(f_{PWM} \times 2^N)$ of the master clock M by two.

According to the embodiment, in an audio signal processor, it is possible to provide a PWM modulation device which is capable of improving a resolution of a PWM modulator which PWM-modulates a result of noise shaping for an oversampling output, and a sound signal output apparatus to which the PWM modulation device is applied.

Other Embodiments

As described above, the present disclosure has been illustrated by way of some embodiments, but the description and drawings which constitute a part of the present disclosure are exemplary and should not be construed to limit the present disclosure. Various alternative embodiments, examples and operation techniques will be apparent to those skilled in the art from the present disclosure.

Thus, the present disclosure includes other different embodiments which are not described herein.

According to the present disclosure in some embodiments, it is possible to provide a PWM modulation device which is capable of a resolution of a PWM modulator, and a sound signal output apparatus to which the PWM modulator device is applied.

The PWM modulation device and the sound signal output apparatus of this embodiment can be applied to a variety of fields including televisions, radios, radio cassettes, car audios, home theater systems, audio components, mobile phones, smartphones, electronic musical instruments, and other equipment for outputting sounds.

While certain embodiments have been described, these embodiments have been presented by way of example only, and are not intended to limit the scope of the present disclosures. Indeed, the novel methods and apparatuses described herein may be embodied in a variety of other forms; furthermore, various omissions, substitutions and changes in the form of the embodiments described herein may be made without departing from the spirit of the present disclosures. The accompanying claims and their equivalents are intended to cover such forms or modifications as would fall within the scope and spirit of the present disclosures.

What is claimed is:

1. A PWM modulation device comprising:
    a PWM modulator which receives upper N bits of an (N+1)-bit output from a noise shaper;
    a rising and falling edge detector which receives a PWM output signal of the PWM modulator and detects a rising and falling edge;
    a delay circuit which receives the PWM output signal, delays the PWM output signal by a predetermined delay time and outputs a PWM output delay signal;
    an AND gate which receives a lower one bit output from the noise shaper and an output control signal of the rising and falling edge detector; and
    a selector which receives a signal obtained as a result of an AND operation by the AND gate for the output control signal and the lower one bit and selects one of the PWM output signal and the PWM output delay signal.

2. The PWM modulation device of claim 1, wherein an output of the selector is the PWM output signal when the lower one bit is data 0, and is a signal obtained by delaying a high level section of the PWM output signal by the delay time when the lower one bit is data 1.

3. The PWM modulation device of claim 1, further comprising a master clock generator which supplies a master clock to the PWM modulator.

4. The PWM modulation device of claim 3, wherein, if a sampling frequency of the PWM modulator is $f_{PWM}$ and a frequency of the master clock is $f_M$, the master clock frequency $f_M$ is equal to $f_{PWM} \times 2^N$ and the delay time is equal to $1/(f_{PWM} \times 2^{N+1})$ which is a value obtained by dividing the period $(1/(f_{PWM} \times 2^N))$ of the master clock by two.

5. The PWM modulation device of claim 3, wherein the master clock generator is contained in the PWM modulator.

6. The PWM modulation device of claim 1, wherein the PWM modulator is a pulse width modulator which generates an output signal by changing a pulse width of an input signal, the PWM modulator comprising:
 a sequence counter which counts a count value in synchronization with a master clock;
 an intermediate register processing part which determines whether the input signal is a first input signal pattern or a second input signal pattern, changes a pulse width such that a front and rear of a switching time point are symmetrical with respect to the switching time point of a switching period of the input signal based on the count value of the sequence counter if the input signal is the first input signal pattern, changes the pulse width by one master clock at the front or rear of the switching time point with respect to the switching time point of the switching period of the input signal based on the count value of the sequence counter if the input signal is the second input signal pattern, and outputs the changed pulse width as an intermediate register value; and
 a decoder which generates an output signal based on the intermediate register value of the intermediate register processing part based on the counter value of the sequence counter.

7. The PWM modulation device of claim 6, wherein the sequence counter counts up the count value in synchronization with the master clock and counts down the count value in synchronization with the master clock at the switching time point of the switching period.

8. The PWM modulation device of claim 7, wherein the sequence counter counts up and down the count value in response to a magnification of oversampling of the input signal.

9. The PWM modulation device of claim 1, wherein the delay circuit comprises a a plurality of inverters connected in series.

10. The PWM modulation device of claim 1, wherein the delay circuit comprises:
 an inverter which receives a master clock; and
 a gate delay circuit which receives an inverted master clock, which is obtained by inverting the master clock with the inverter, and an output of the PWM modulator.

11. A sound signal output apparatus comprising:
 a synchronous sampling rate converter;
 a digital signal processor connected to the synchronous sampling rate converter;
 an oversampling filter connected to the digital signal processor;
 a noise shaper connected to the oversampling filter;
 first and second PWM modulation devices connected to the noise shaper;
 first and second driver output stages connected respectively to outputs of the first and second PWM modulation devices;
 first and second low pass filters connected respectively to outputs of the first and second driver output stages; and
 a speaker connected to the first and second low pass filters.

12. The sound signal output apparatus of claim 11, comprising:
 a second PWM modulation device connected to the noise shaper;
 a second driver output stage connected to an output of the second PWM modulation device; and
 a second low pass filter connected to an output of the second driver output stage and connected to the speaker.

13. The sound signal output apparatus of claim 12, wherein each of the first and second PWM modulation devices comprises:
 a PWM modulator which receives upper N bits of an (N+1)-bit output from the noise shaper;
 a rising and falling edge detector which receives a PWM output signal of the PWM modulator and detects a rising and falling edge;
 a delay circuit which receives the PWM output signal, delays the PWM output signal by a predetermined delay time and outputs a PWM output delay signal;
 an AND gate which receives a lower one bit output from the noise shaper and an output control signal of the rising and falling edge detector; and
 a selector which receives a signal obtained as a result of an AND operation by the AND gate for the output control signal and the lower one bit and selects one of the PWM output signal and the PWM output delay signal.

14. The sound signal output apparatus of claim 13, wherein an output of the selector is the PWM output signal when the lower one bit is data 0, and is a signal obtained by delaying a high level section of the PWM output signal by the delay time when the lower one bit is data 1.

15. The sound signal output apparatus of claim 13, further comprising a master clock generator which supplies a master clock to the PWM modulator.

16. The sound signal output apparatus of claim 15, wherein, if a sampling frequency of the PWM modulator is $f_{PWM}$ and a frequency of the master clock is $f_M$, the master clock frequency $(f_M)$ is equal to $f_{PWM} \times 2^N$ and the delay time is equal to $1/(f_{PWM} \times 2^{N+1})$ which is a value obtained by dividing the period $(1/(f_{PWM} \times 2^N))$ of the master clock by two.

17. The sound signal output apparatus of claim 13, wherein the delay circuit comprises a plurality of inverters connected in series.

18. The sound signal output apparatus of claim 13, wherein the delay circuit comprises:
 an inverter which receives a master clock; and
 a gate delay circuit which receives an inverted master clock, which is obtained by inverting the master clock with the inverter, and an output of the PWM modulator.

19. The sound signal output apparatus of claim 11, wherein the sound signal output apparatus comprises a BTL-based D-class amplifier.

* * * * *